United States Patent
Iwaki

(10) Patent No.: US 7,956,461 B2
(45) Date of Patent: Jun. 7, 2011

(54) SEMICONDUCTOR APPARATUS INCLUDING SEMICONDUCTOR CHIP WITH STRESS MATERIAL SELECTIVELY PROVIDED IN REGION OF WIRING LAYER

(75) Inventor: Takayuki Iwaki, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 117 days.

(21) Appl. No.: 12/230,684

(22) Filed: Sep. 3, 2008

(65) Prior Publication Data
US 2009/0057893 A1 Mar. 5, 2009

(30) Foreign Application Priority Data
Sep. 5, 2007 (JP) ................................. 2007/229682

(51) Int. Cl.
*H01L 23/482* (2006.01)
(52) U.S. Cl. .. 257/737; 257/778; 257/781; 257/E23.021
(58) Field of Classification Search ................ 257/781
See application file for complete search history.

(56) References Cited

U.S. PATENT DOCUMENTS
6,313,537 B1 11/2001 Lee et al.
7,297,572 B2 * 11/2007 Salmon ......................... 438/106

FOREIGN PATENT DOCUMENTS
JP 11-186320 7/1999
JP 2000-340569 12/2000
WO WO 2007/064073 A1 * 6/2007

* cited by examiner

*Primary Examiner* — Stephen W Smoot
(74) *Attorney, Agent, or Firm* — McGinn IP Law Group, PLLC

(57) ABSTRACT

In order to solve a problem of occurrence of delamination of interlayer film due to occurrence of a crack in an LSI wiring layer in a UBM lower layer immediately under a solder bump in an outer periphery of an LSI chip, a semiconductor apparatus of the present invention includes a stress boundary between compressive stress and tensile stress in an LSI wiring layer of a bump lower layer and in order to alleviate the stress present in the bump lower layer tensile stress material is arranged on a compressive stress side or compressive stress material is arranged on a tensile stress side with a stress boundary of the LSI wiring layer as a boundary.

15 Claims, 8 Drawing Sheets

SEMICONDUCTOR APPARATUS INCLUDING SEMICONDUCTOR CHIP WITH STRESS MATERIAL SELECTIVELY PROVIDED IN REGION OF WIRING LAYER

BACKGROUND OF THE INVENTION

1. Field of the Invention

The present invention relates to a semiconductor apparatus including wiring structure under a bump which reduces, in particular, the probability of occurrence of a crack in a semiconductor chip.

2. Description of the Related Art

In the recent years, a semiconductor apparatus which is used for a high-end computer such as backbone communication apparatus is required to undergo high integration and show high-end performance. Accompanied by the demand, high integration, which mounts a lot of chips in one package and results in increase of package size or the number of pins is progressing.

In a multi-pinned package, the number of pins (number of bumps) increases and, therefore, improvement in the yield factor and reliability in the periphery of an under bump metal (equivalent to pad) to become pins at the time of assembly, that is, bumps and their stands is extremely important. Reliability technology related to the periphery of those bump is described in the following patent documents.

Japanese Patent Laid-Open No. 11-186320 discloses structure of arranging no pad of a lower layer immediately under an uppermost layer pad opening window for preventing cracks in a lower layer of the uppermost layer pad but arranging, only in a frame part on one face side among four faces in the uppermost layer pad region, a pad on the lower layer and a via bringing the pad on the lower layer and a pad on the uppermost layer into connection.

Moreover, Japanese Patent Laid-Open No. 2000-340569 discloses structure of forming a reinforcing insulating layer between a pad and a wiring layer immediately under the pad in an attempt to suppress crack occurrence under the pad likewise Japanese Patent Laid-Open No. 11-186320 described above.

However, stress that is concentrated to an edge of UBM (under bump metal), in particular, and an edge of a UBM via in the lower layer of the pad was not brought into consideration for preventing a conventional crack under a pad from occurring. In addition, the directionality of stress such as tensile stress and compressive stress that is present in the lower layer of the pad was not put into consideration, either.

Therefore, in the case of arranging the via in the frame part of only one face among four faces of the pad region as in Japanese Patent Laid-Open No. 11-186320, selection of that one face occasionally strengthens the stress to the contrary. In addition, Japanese Patent Laid-Open No. 2000-340569 is similar as well. The reinforcing insulating layer, which is just arranged, will strengthen the stress under the pad to the contrary according to where the layer is arranged.

Consequently, a device, which was assembled without consideration on where the stress is concentrated under the pad and on the directionality of stress, will result in a great number of occurrences of defects to give rise to cracks in the interlayer film of an LSI wiring layer immediately under the pad.

SUMMARY OF THE INVENTION

In order to solve the problem described above, a semiconductor apparatus according to the present invention comprises, a semiconductor chip, a bump on the semiconductor chip and an LSI wiring layer under the bump, wherein the LSI wiring layer has stress boundary between compressive stress and tensile stress under the bump and a via plug being tensile stress material is arranged in a region where compressive stress occurs and compressive stress material is arranged in a region where tensile stress occurs so as to alleviate those both kinds of stress with a stress boundary as a boundary.

More preferably, the via plug and the compressive stress material are arranged immediately under a UBM edge and immediately under a UBM via edge, in particular. Wiring for the LSI wiring layer and the via plug described above are preferably made of Cu.

Moreover, as for compressive stress material, nitride ceramics such as SiCN, SiN, TiN and TaN in general and Ta and the like are preferable.

As described above, according to the present invention, crack defects occurring in a lower layer of an UBM in the vicinity of an outer periphery, in particular, can be reduced. A reason thereof is that measures are taken in consideration of directionality and a site of concentration of stress occurring in a UBM lower layer.

Specifically, with the bump center point as the boundary, materials, which alleviate compressive stress on one hand and tensile stress on the hand corresponding to occurring stress so as to negate those stresses, are arranged. That is, for the compressive stress, a via plug and the like being tensile stress material is arranged. For the tensile stress, compressive stress material is arranged. In addition, the material alleviating the stress described above is arranged immediately under the UBM edge and the UBM via edge, in particular, where stress is concentrated.

DETAILED DESCRIPTION OF THE PREFERRED EMBODIMENTS

Embodiments of the present invention will be described in detail with the following drawings in order to clarify the above described and the other objects, property and advantages of the present invention.

First Embodiment

Figure 1:
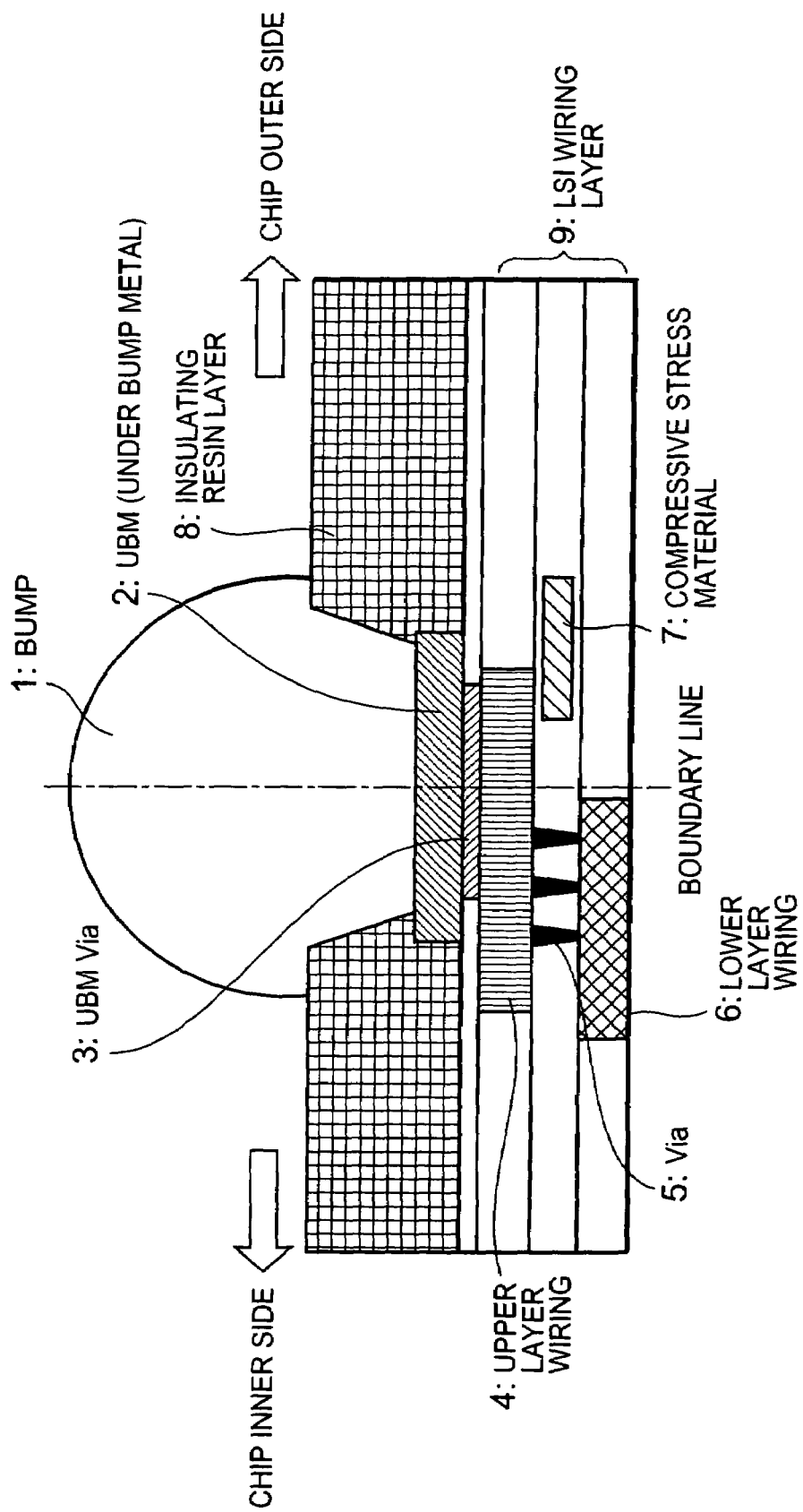
FIG. 1 is a diagram illustrating a sectional view of a semiconductor apparatus of a first embodiment of the present invention.
Figure 2:
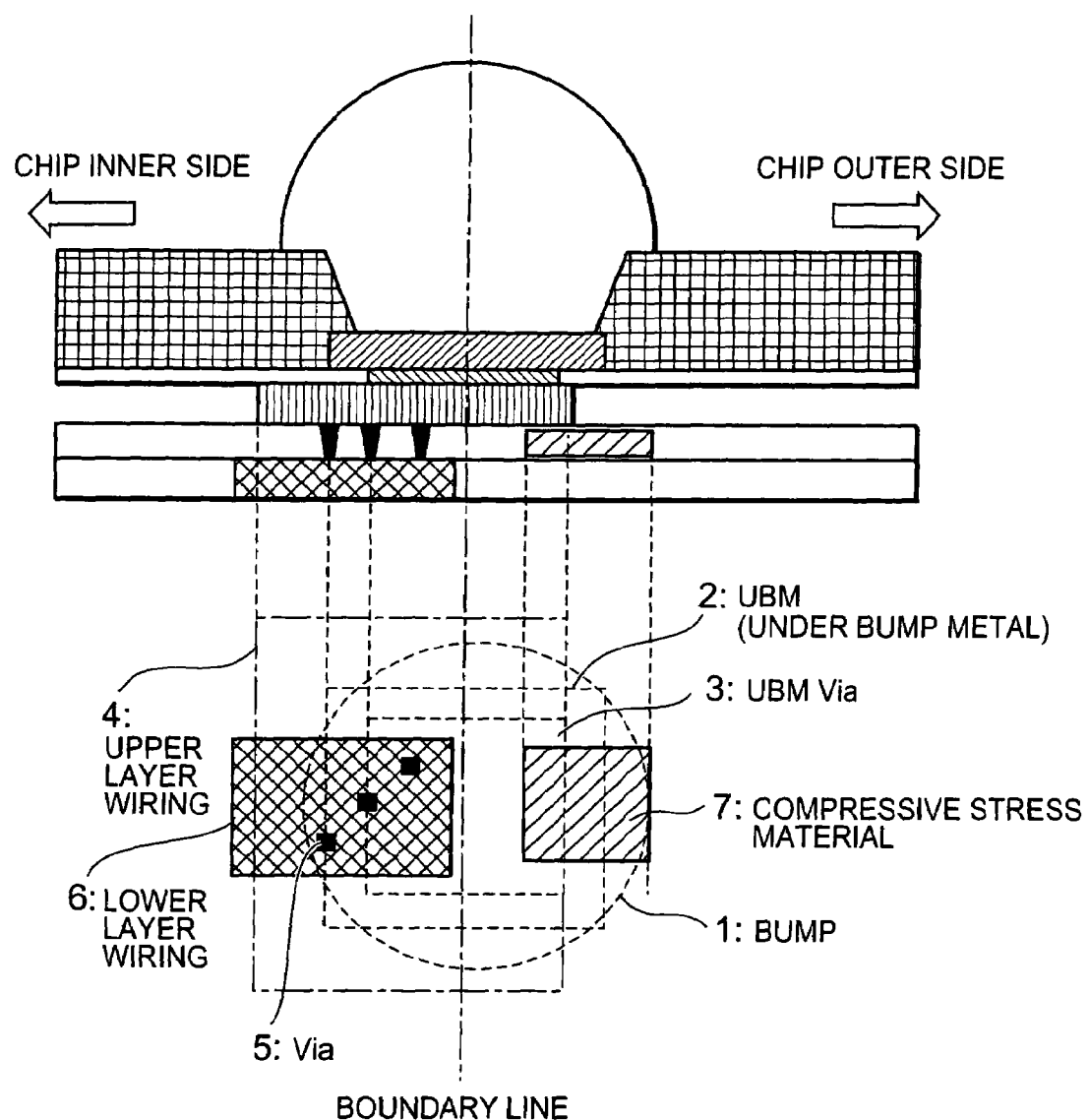
FIG. 2 is a diagram illustrating a plan view of the semiconductor apparatus of the first embodiment of the present invention.

FIG. 1 to FIG. 2 are drawings illustrating a semiconductor apparatus of a first embodiment of the present invention. FIG.

1 is a sectional view of a semiconductor apparatus in the first embodiment of the present invention; and FIG. 2 is a plan perspective view of the sectional view in FIG. 1 looked at from the above.

In FIG. 1, a bump 1 is embedded at an opening of an insulating resin layer 8. The bump described above sits on the stand made of UBM (under bump metal) 2. The lower layer of the UBM comprises a UBM via 3 for conduction from the bump to the upper layer wiring 4. The upper layer wiring 4 is connected to a lower layer wiring 6 through a via plug 5. These upper layer wiring 4, lower layer wiring 6 and via plug 5 are also referred to collectively as an LSI layer wiring 9. As apparent from this drawing, with the bump center line as a boundary line, a via plug 5 is arranged toward the chip inner side and compressive stress material 7 is arranged toward chip outer side.

FIG. 2 illustrates a plan perspective view of the same site, for the sectional view in FIG. 1. Here, a semiconductor ship is looked up from the lower direction. With the center line of a solder bump as a boundary line, a via plug 5 is arranged toward the chip inner side and compressive stress material 7 is arranged toward chip outer side. Moreover, the via plug 5 and the compressive stress material 7 are arranged immediately under an edge of the UBM 2 and the UBM via 3.

In addition, with FIG. 3, an entire image of the LSI chip will be described. Here, in a simple manner, the case where the chip 101 has eight bumps in the outermost periphery is illustrated. However, actually, the number of bumps is greater so that those bumps form a matrix vertically and horizontally. The stress occurring immediately under these bumps in the outermost periphery is larger than the bumps in the inner periphery. A centripetal line L1 connecting a center point C1 of the LSI chip with a center point C2 between the bumps 102 and 103 is presupposed. A line crossing the centripetal line L1 perpendicularly on the LSI chip surface and passing the center C2 of the bump is presupposed as a stress boundary line L2.

Figure 3:
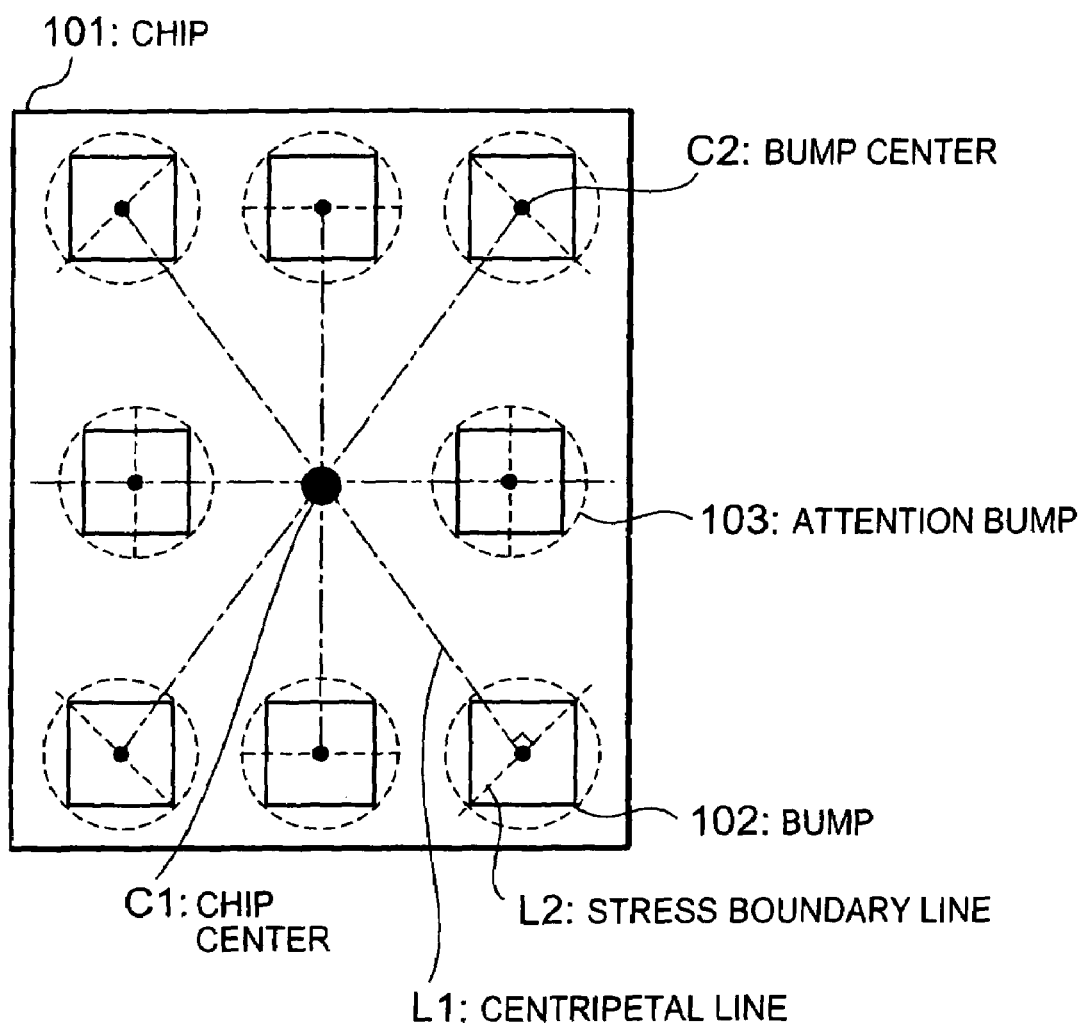
FIG. 3 is a diagram illustrating the semiconductor apparatus in its entirety of the first embodiment of the present invention.
Figure 4:
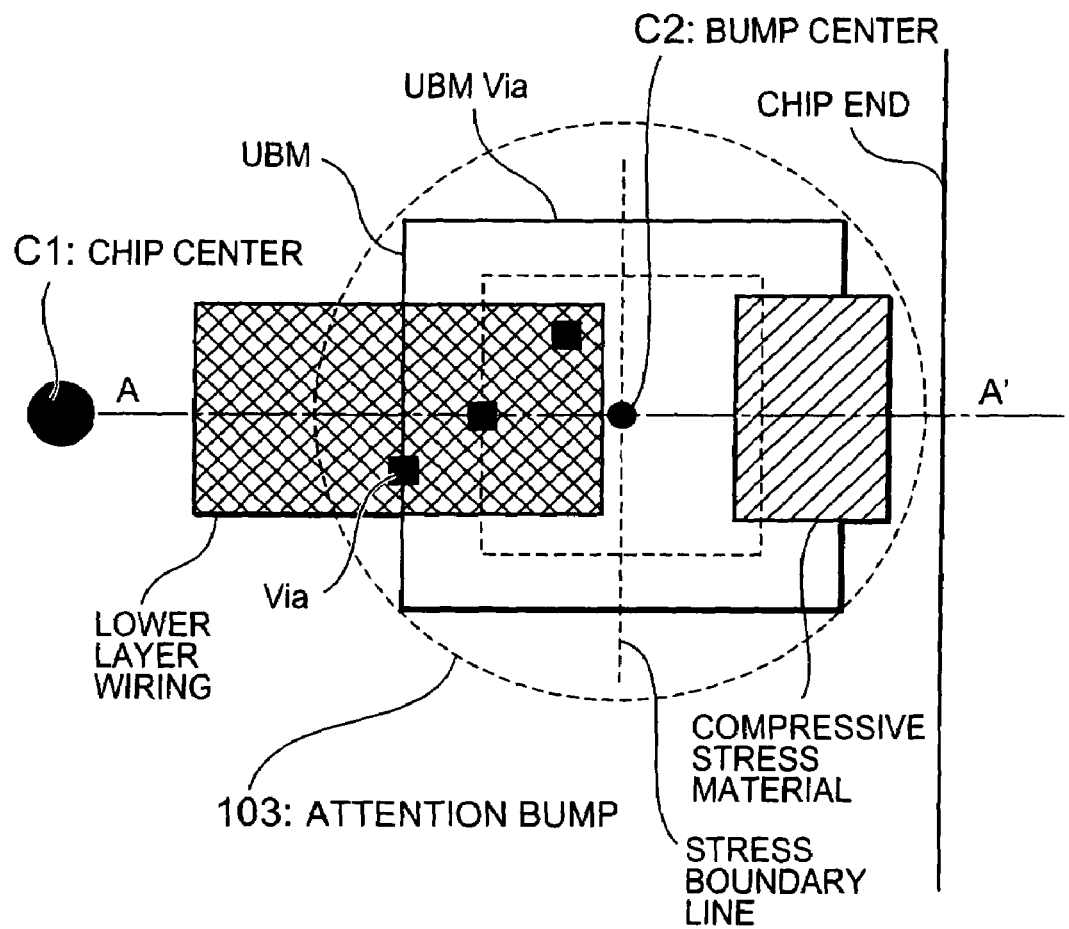
FIG. 4 is a diagram illustrating the semiconductor apparatus of the first embodiment of the present invention in a partial plan view.

FIG. 4 illustrates an enlarged view of an attention bump 103 in FIG. 3. This diagram is a wiring layout of the bump and immediately under the bump likewise FIGS. 1 and 2. The diagram illustrates relative relationship among the chip center, the chip end and the wiring under the bump.

Back to FIG. 3, corresponding to the bump position, the position of the stress boundary line is changed. With those stress boundary lines as boundaries, an example where compressive stress occurs on the chip center side and tensile stress occurs on the chip end side was adopted.

A result of device simulation carried out by the inventor for supporting the distribution state of stress described above is illustrated in FIG. 5. The X axis/Y axis respectively represent distance/stress from the bump center for the point of origin. The positive direction toward the upper side of the Y axis from the point of origin represents tensile stress. The opposite negative direction represents compressive stress.

Figure 7:
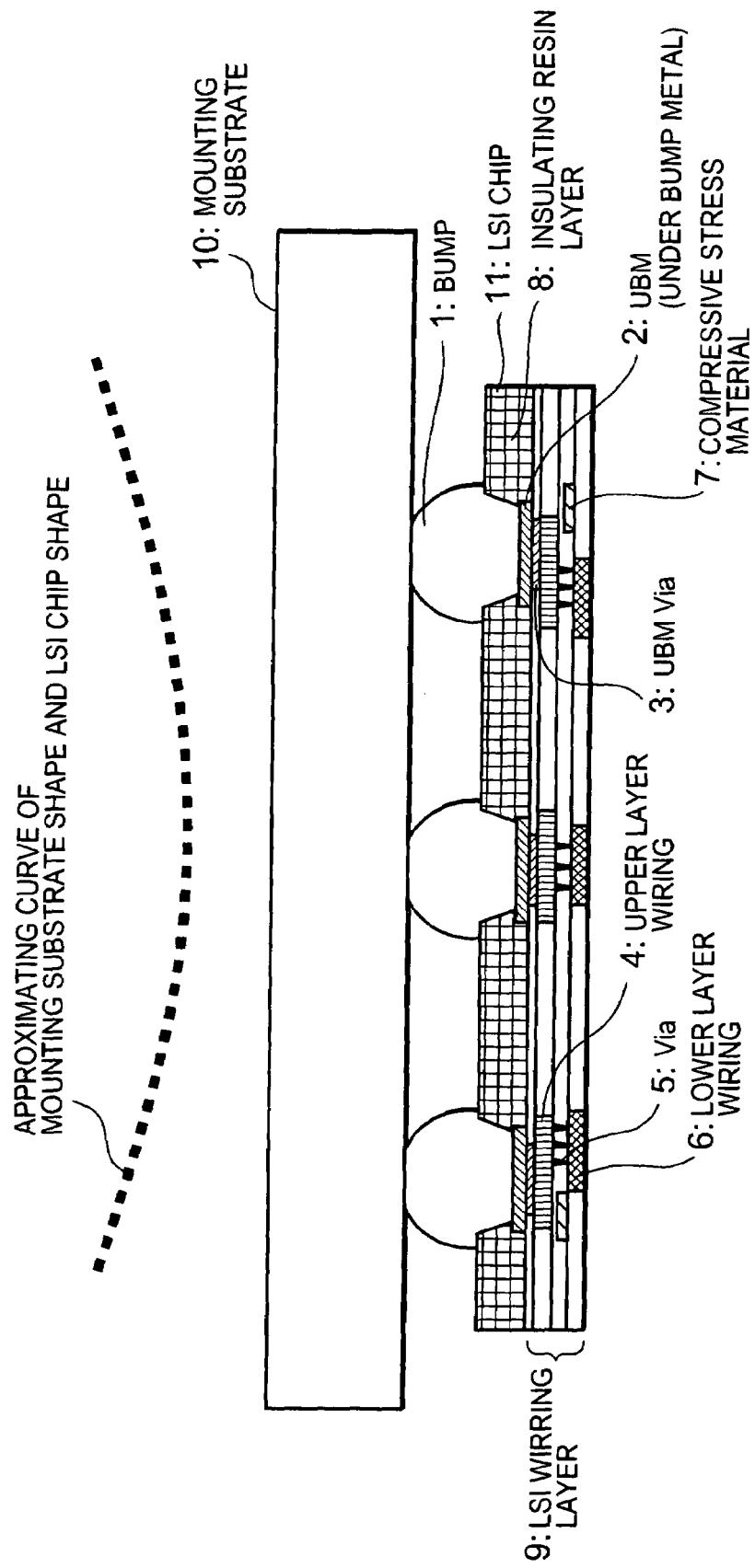
FIG. 7 is a diagram illustrating the semiconductor apparatus of the first embodiment of the present invention connected to another apparatus.

In addition, the present simulation conditions will be briefly described with FIG. 7. At first, the case where an LSI chip 11 to become an object undergoes mounting on a mounting substrate 10 is imagined. The environment in the case of arranging the bump 1, the UBM 2, the UBM via 3 on the LSI chip side, applying heat of 220° C. to the both parties and cooling to 25° C. was reproduced. Stress occurring on the wiring layer beneath the bump of the LSI chip was plotted.

Figure 5:
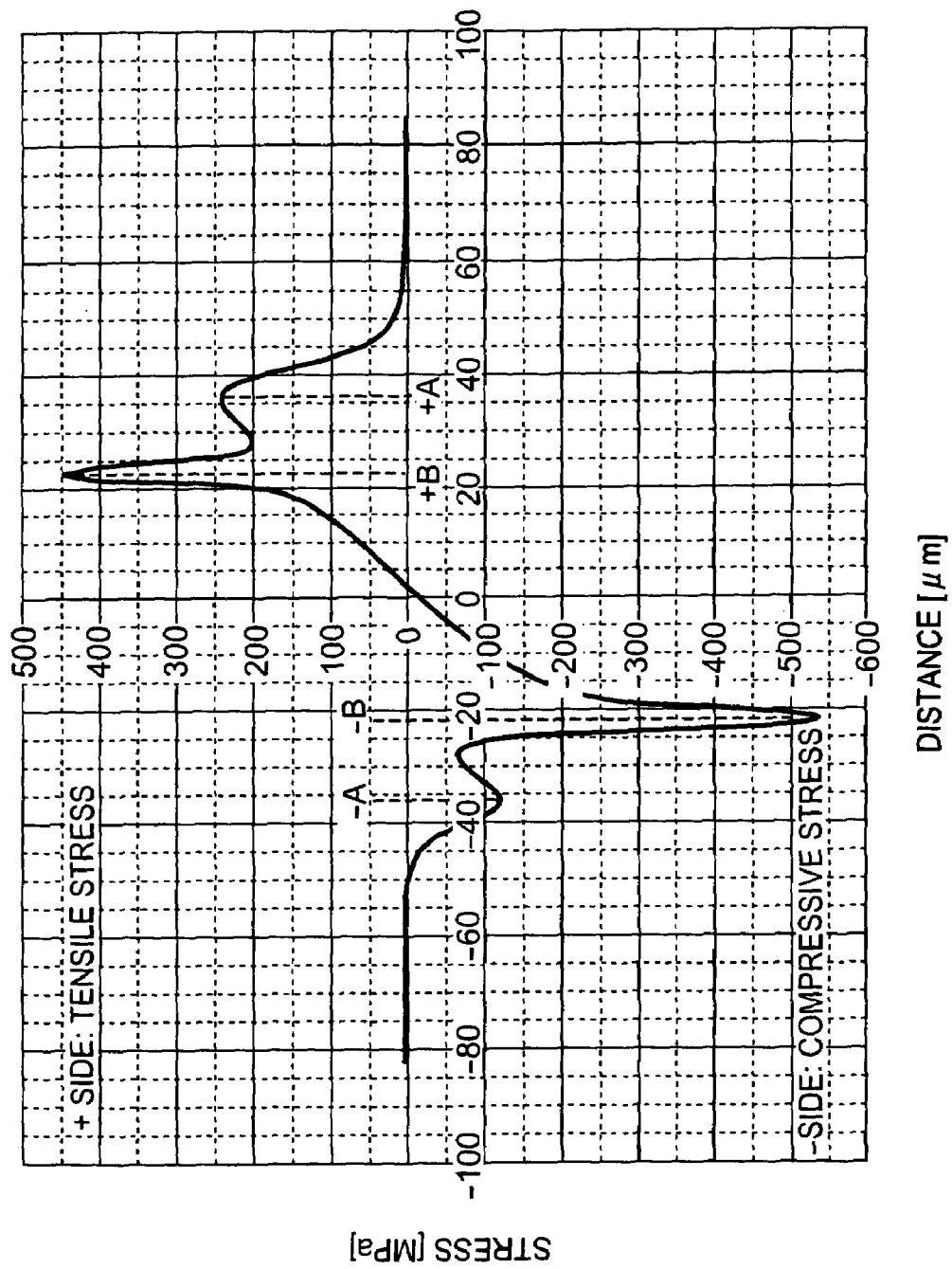
FIG. 5 is a diagram illustrating conventional stress property.

That simulation result can overlap on an A-A sectional diagram in FIG. 4. The point of origin in FIG. 5 is taken as the position C2 in FIG. 4. The via plug and the compressive stress material are arranged in FIG. 4 but are not arranged under the simulation conditions in FIG. 5.

As apparent from FIG. 5, the stress will enter complementary relation between the inner side and the outer side of the chip with the point of origin as the center. The stress will become compressive stress inside the chip, that is, in the chip center direction. In addition, the stress will become tensile stress outside the chip, that is, in the chip end direction.

In further detail, the size of the stress apparently has four peaks in total at two sites each for inside and outside the chip. An edge of the UBM and an edge of the UBM via are present on the X axis where a peak goes, that is, in the position from the bump center. That is, width of the UBM is indicated by +A to −A points and width of the UBM via is indicated by +B to −B points on the X axis in the drawing.

In other words, an edge of the UBM is present on the +A and −A points and an edge of the UBM via is present on the +B and −B points.

Figure 6:
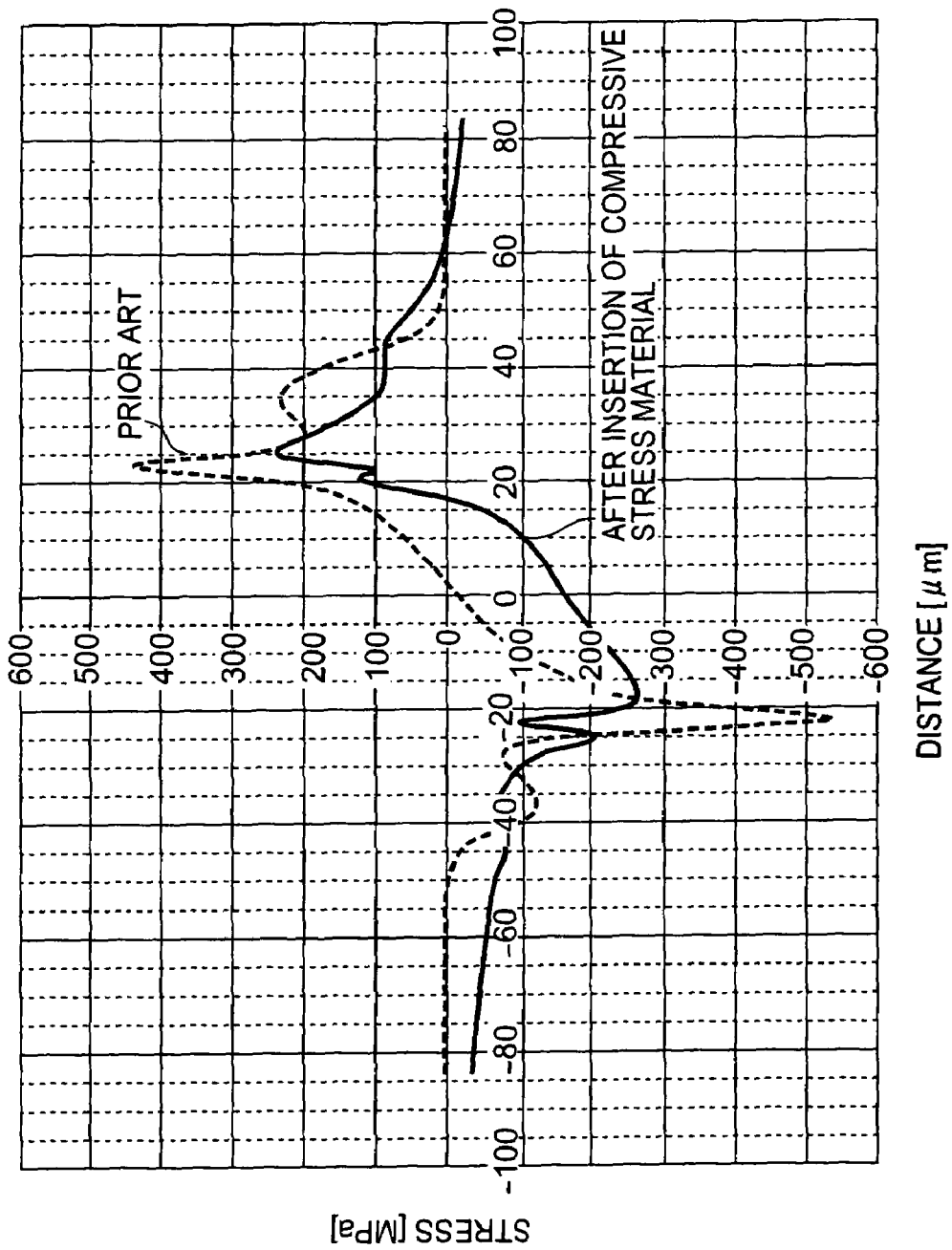
FIG. 6 is a diagram illustrating stress property of the present invention.

A simulation result of arranging stress alleviating material only under the UBM on the chip end side with the stress boundary line as the boundary under the stress conditions as in FIG. 5 is illustrated in FIG. 6.

Here, alleviation of tensile stress outside the chip compared with the prior arts indicated by dotted lines corresponding to FIG. 5 can be interpreted. In addition, coupled alleviation of compressive stress inside the chip in complementary relation can be also interpreted.

That is, stress outside the chip under the bump is alleviated by arranging compressive stress material against tensile stress being present outside the chip. Alleviation of that tensile stress allowed alleviation of the compressive stress being present inside the chip to establish symmetrical relation.

Here, description on the simulation result will be omitted. However, the advantage likewise the result described above is obtained also in the case of arranging a via plug providing tensile stress immediately under the bump on the chip inner side providing compressive stress.

Here, an example of bringing an LSI chip and a mounting substrate has been described for the present embodiment, as illustrated in FIG. 7. The case where the LSI chip bends upward with the mounting substrate as illustrated with dotted line in FIG. 7 is assumed. The drawing is two dimensional. However, actually, the four corners of the LSI chip bends upward against the mounting substrate.

However, the case where the LSI chip bends in the opposite direction unlike the present embodiment can occur according to the respective conditions such as the mounting method and conditions of the LSI chip or the type of the mounting substrate. That is, the case of bending downward against the mounting substrate is naturally present. In such a case, the direction of stress will be opposite from the direction in the present embodiment. It goes without saying that the arrangement of material for alleviating that stress is also desired to be opposite from the arrangement in the present embodiment. In addition, this embodiment was exemplified only a tensile stress material being provided in inside of a chip under a bump, but it was not limited to this. For example, it is possible to provide a tensile stress material in the outside of a chip under a bump. And a density of tensile stress materials in an inside of chip under a bump may come to have thicker than the outside of chip under a bump. Of course a size of tensile material in an inside of chip under bump may come to have larger than an outside of chip under a bump. So far, an example of a UBM and a UBM via corresponding to each bump respectively is illustrated in FIGS. 1 and 2.

Second Embodiment

Figure 8:
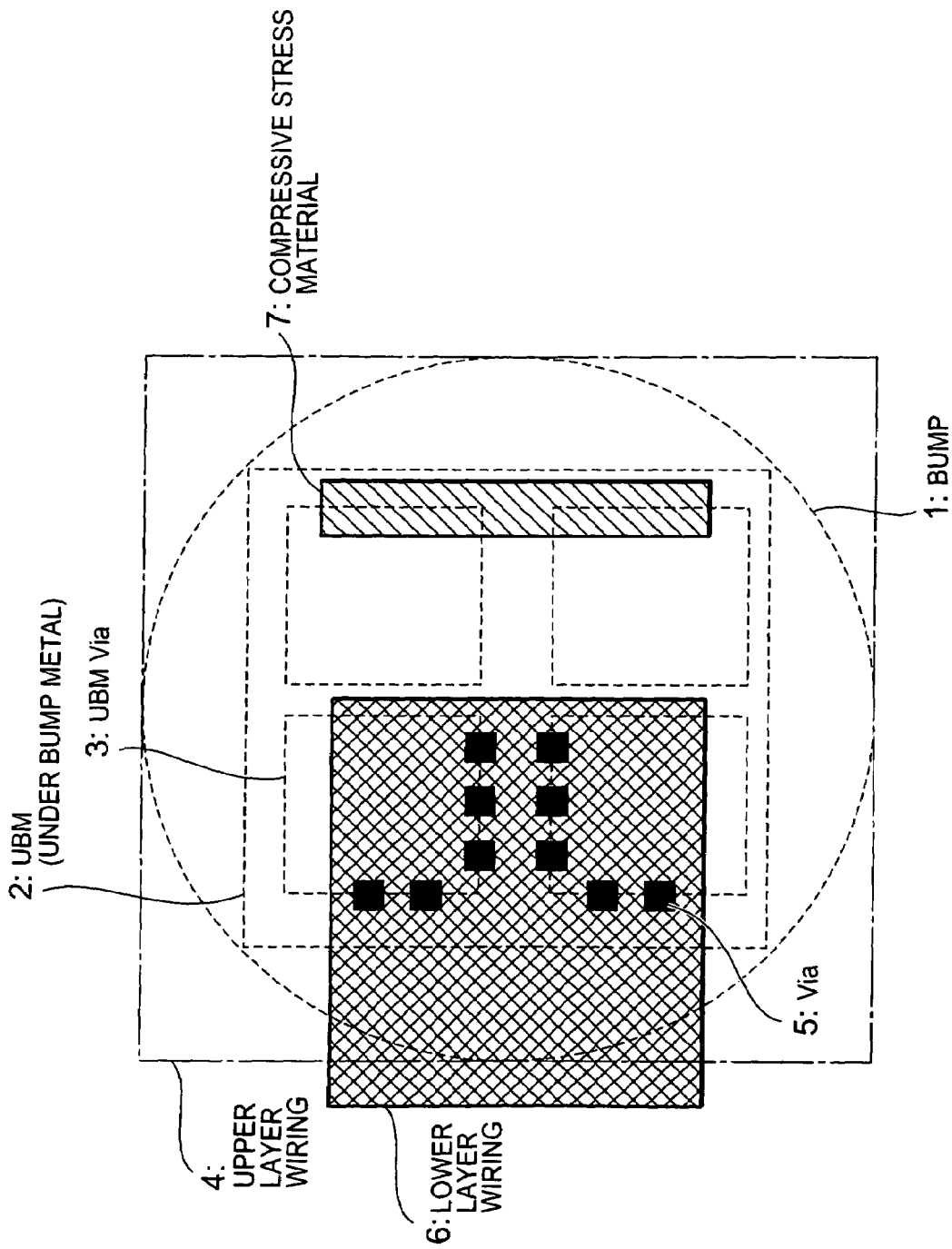
FIG. 8 is a diagram illustrating a plan view of a semiconductor apparatus of a second embodiment of the present invention.

Here, an example of UBM via being present in plurality for a bump and UBM will be illustrated in FIG. 8. Likewise FIGS. 1 and 2, there are chip inner side and chip outer side on left and right direction on the sheet respectively. In addition, one UBM corresponds to one solder bump 1 and four UBM vias 3 correspond to that one UBM.

A via plug 5 is arranged in a edge part of the UBM via toward the chip inner side with a predetermined boundary line 10 as a boundary also in FIG. 8, likewise FIGS. 1 and 2. Compressive stress material 7 is arranged symmetrically toward the chip outer side.

Here, the present invention will not be limited to each of embodiments described above. Each embodiment apparently can be altered appropriately within the range of technological thoughts of the present invention. For example, the present embodiment was exemplified by line bisecting a predetermined region immediately under the bump. However, bisection is not required according to stress to occur.

For example, in the case where the aspect ratio of the LSI chip is special, attention is required to the longitudinal side which is strongly influenced by stress. That is, the longitudinal side occasionally requires measures not only for the outermost peripheral bump but also for the peripheral bump being inner than the outermost peripheral bump.

In addition, once again, it goes without saying that the stress can be coped with by appropriately changing material to be arranged in the case where the occurring stress is reversed between the vicinity of the chip center and the vicinity of the chip end.

In addition, it is also possible to interpret the bump with bonding wire and the UBM with bonding pad.

What is claimed is:

1. A semiconductor apparatus, comprising:
a semiconductor chip;
a bump formed on the semiconductor chip;
an under bump metal (UBM) in a lower layer of the bump;
a large scale integration (LSI) wiring layer formed in the semiconductor chip; and
a UBM via connecting the LSI wiring layer to the UBM,
wherein the LSI wiring layer includes a first region and a second region being divided by a second line perpendicularly crossing a first line obtained by connecting a center point of the semiconductor chip and a point in a lower layer below a center point of the bump, and
wherein a stress material is selectively provided in the first region.

2. The semiconductor apparatus according to claim 1, wherein the stress material comprises a tensile stress material or a compressive stress material.

3. The semiconductor apparatus according to claim 1, wherein the LSI wiring layer further comprises a compressive stress material or a tensile stress material in the second region to establish complementary relation with a tensile stress material or a compressive stress material in the first region.

4. The semiconductor apparatus according to claim 1, wherein the second line passes through the center point of the bump.

5. The semiconductor apparatus according to claim 1, wherein the stress material is arranged immediately under an edge part of the UBM and an edge part of the UBM via.

6. The semiconductor apparatus according to claim 1, wherein the bump comprises a bump in a vicinity of an outer periphery of the semiconductor chip.

7. The semiconductor apparatus according to claim 6, wherein the bump comprises a bump being present on an extension of the first line and a closest to a periphery of the semiconductor chip.

8. The semiconductor apparatus according to claim 1, wherein the LSI wiring layer consists of an upper layer wiring, a lower layer wiring, and a via plug connecting the upper layer wiring to the lower layer wiring, and
wherein the via plug comprises a tensile stress material.

9. The semiconductor apparatus according to claim 1, wherein said stress material is only provided in the first region.

10. The semiconductor apparatus according to claim 1, wherein said stress material is provided in both the first region and the second region, and
wherein a density of said stress material in the first region is higher than that in the second region.

11. The semiconductor apparatus according to claim 1, wherein said stress material is provided in both the first region and the second region, and
wherein said stress material in the first region is larger than that in the second region.

12. A semiconductor apparatus, comprising:
a compressive stress material;
a semiconductor chip;
a bump formed on the semiconductor chip;
an under bump metal (UBM) arranged in a first region, the first region being confined below the bump in a plan view of the apparatus;
a large scale integration (LSI) wiring layer consisting of an upper layer wiring, a lower layer wiring, and a via plug bringing both wirings into connection, each formed in the semiconductor chip; and
a plurality of UBM vias connecting the LSI wiring layer to said UBM,
wherein the first region is bisected into a third region, which is closer to a center point of the semiconductor chip than a fourth region, and the fourth region by a desired line,
wherein the via plug is arranged in the LSI wiring layer in a lower layer of the third region, and
wherein the compressive stress material is arranged in the LSI wiring layer in a lower layer in the fourth region.

13. The semiconductor apparatus according to claim 12, wherein the compressive stress material is arranged in the LSI wiring layer at least in one of immediately under an edge of the UBM and immediately under an edge of the UBM via in the fourth region.

14. A semiconductor apparatus, comprising:
a semiconductor chip;
a bump formed on the semiconductor chip;
an under bump metal (UBM) arranged in a first region, the first region being confined below the bump in a plan view of the apparatus;
a large scale integration (LSI) wiring layer consisting of an upper layer wiring, a lower layer wiring, and a via plug bringing both wirings into connection, each formed in the semiconductor chip;
a compressive stress material formed in the LSI wiring layer; and
a plurality of UBM vias connecting the LSI wiring layer to said UBM,
wherein the first region is bisected into a third region, which is closer to a center point of the semiconductor chip than a fourth region, and the fourth region by a desired line, and
wherein the via plug is arranged in the LSI wiring layer in a lower layer of the third region.

15. The semiconductor apparatus according to claim 14, wherein the compressive stress material is formed in the fourth region.

* * * * *